United States Patent

Morita

(10) Patent No.: US 7,034,334 B1
(45) Date of Patent: Apr. 25, 2006

(54) LIQUID CRYSTAL DISPLAY APPARATUS

(75) Inventor: Toshiyuki Morita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/354,190

(22) Filed: Jul. 15, 1999

(30) Foreign Application Priority Data

Jul. 16, 1998 (JP) ................................. 10-201789

(51) Int. Cl.
*H01L 29/04* (2006.01)
*H01L 31/20* (2006.01)

(52) U.S. Cl. .......................................... 257/59; 257/72
(58) Field of Classification Search ................ 394/104, 394/96, 40; 257/57, 59, 72
See application file for complete search history.

(56) References Cited

U.S. PATENT DOCUMENTS 5,347,378 A * 9/1994 Handschy et al. ............ 349/78

FOREIGN PATENT DOCUMENTS

JP          410026755 A  * 1/1998

* cited by examiner

*Primary Examiner*—Phat X. Cao
*Assistant Examiner*—Theresa T. Doan
(74) *Attorney, Agent, or Firm*—Scully, Scott, Murphy & Presser, P.C.

(57) ABSTRACT

In a liquid crystal display apparatus, a conductive agent is spread on a surface of the polarizing plate adhered to a substrate 12 disposed on an opposite side of another substrate 12 to which a color filter is adhered, so that the spread conductive agent has a resistance of $1 \times 10^9$ ohms/square. A protective film is adhered on the spread conductive agent.

By this technique, static electricity generated at the time when the protective film is peeled off is uniformly distributed on the surface of the polarizing plate, thereby not generating non-uniform electrification of the static electricity. As a result, display non-uniformity due to the non-uniform electrification is not generated, and therefore it is not required to conduct an electrification removal operation of the static electricity which takes a long time.

4 Claims, 4 Drawing Sheets

[Fig. 1]
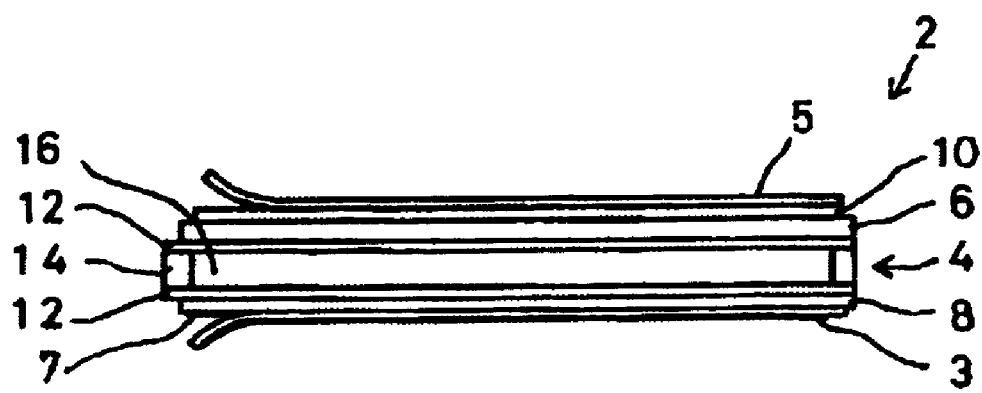
[Fig. 2]
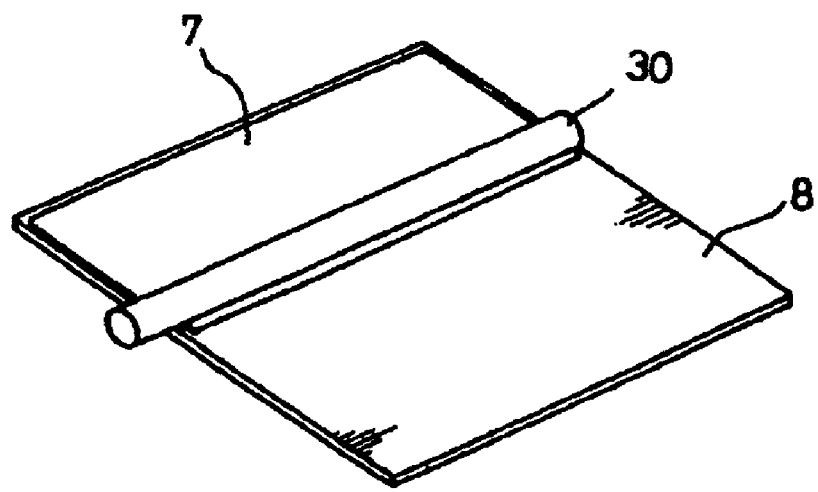

[Fig.3]
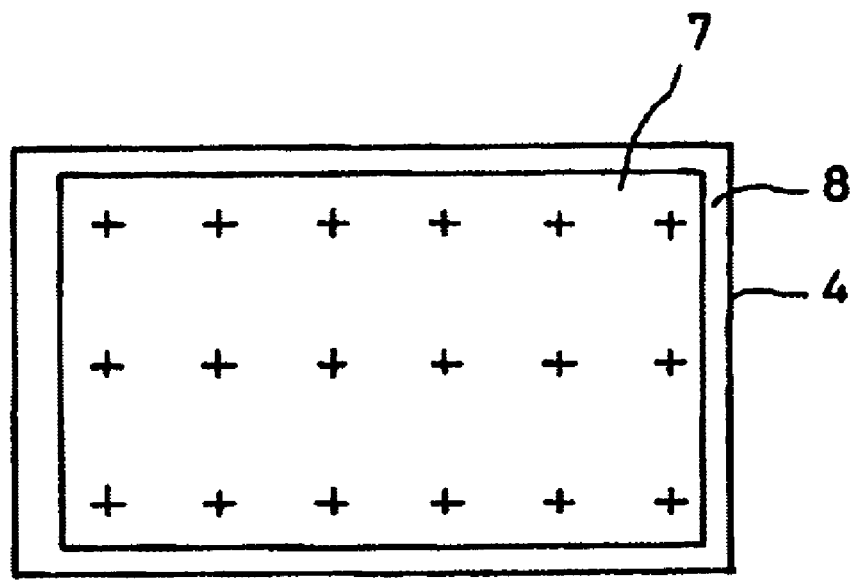
[Fig.4]
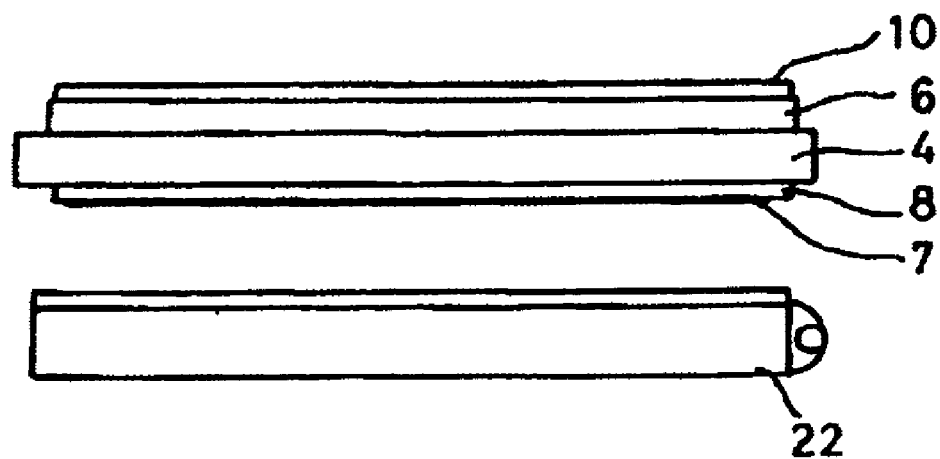

[Fig. 5]
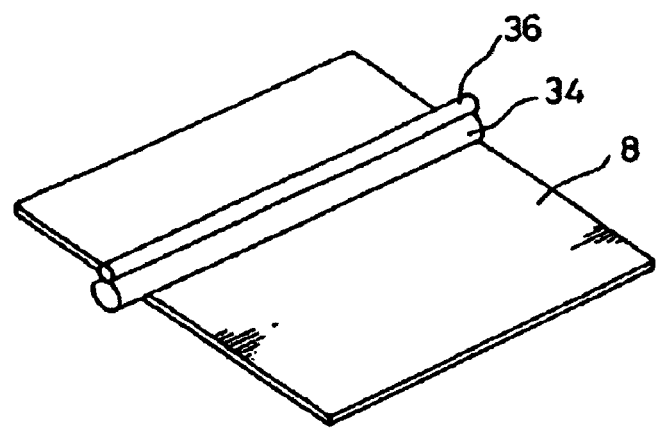
[Fig. 6]
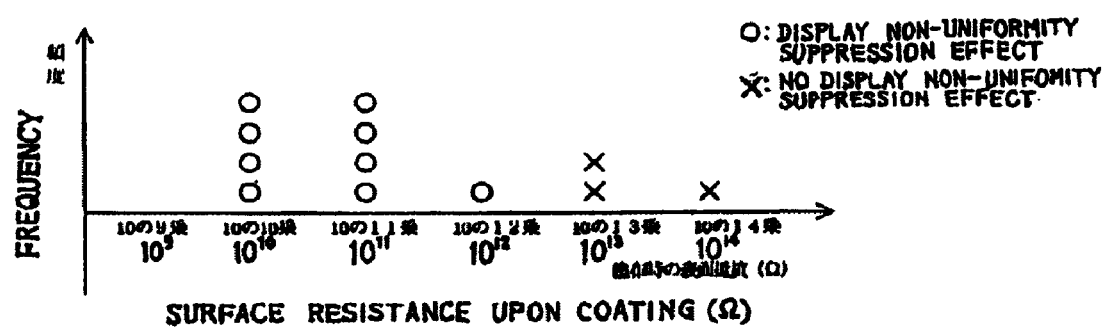

[Fig. 7]
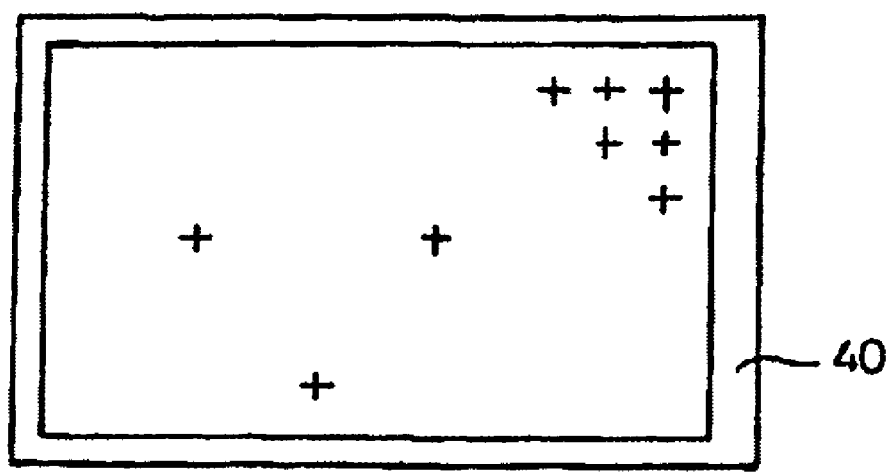

LIQUID CRYSTAL DISPLAY APPARATUS

FIELD OF THE INVENTION

The present invention relates to a TFT liquid crystal display apparatus, more particularly to a liquid crystal display apparatus which can prevent display non-uniformity caused by a static electricity.

BACKGROUND OF THE INVENTION

FIG. 7 is a plan view showing a conventional polarizing plate 40 in which the surface is not coated with any high-resistance conductive agent, and the protective film is peeled off. When the protective film is peeled off, static electricity is generated on the surface of the polarizing plate 40. At this time, since the conventional polarizing plate 40 has a high surface resistance ($1 \times 10^{16}$ ohms/square or more), the generated static electricity is not uniformly distributed, and the potential locally increases, as shown in FIG. 7. These high-potential portions result in display non-uniformity, which requires the removal of electrification of the static electricity for a long time (about 1 min.).

However, since the long-time removal of electrification of the static electricity for suppressing display non-uniformity of the display apparatus decreases productivity, the removal time of electrification must be shortened. In the IPF panel, even if display non-uniformity is suppressed by the long-time removal of electrification, static electricity may still be generated when the polarizing plate rubs against the backlight.

That is, if the polarizing plate contacts the diffusion sheet of the backlight due to vibration, shock, or the like after assembling the backlight, static electricity is generated on the surface of the polarizing plate. For the same reason as described above, the potential locally increases to generate electrified portions, resulting in display non-uniformity.

SUMMARY OF THE INVENTION

The present invention has been made with taking the foregoing problem, which is caused by locally generating static electricity having a high potential on the surface of the polarizing plate, into consideration, and has as its object to provide a liquid crystal display apparatus in which static electricity is uniformly distributed on the surface of an IPF panel so as to prevent any display non-uniformity even when a protective film is peeled off.

In the present invention, in order to solve the foregoing problem, a liquid crystal display apparatus is constituted as follows.

An IPF panel constructed by adhering a pair of polarizing plates, to which protective films are respectively adhered, to front and back surfaces of a liquid crystal display apparatus to which a color filter is adhered, a high-resistance conductive agent is spread on a surface of the polarizing plate adhered on an opposite side of the color filter, so that the spread conductive agent have a resistance of $1 \times 10^9$ ohms/square.

One of the high-resistance conductive agent is a composition including a trialkyl-(2-hydroxyethyl) ammonium salt, pentaerythritol, and ethanol.

Another high-resistance conductive agent is a composition including tin oxide, tetraethoxysilane, polyester resin, and water.

BRIEF DESCRIPTION OF THE DRAWINGS

FIG. 1 shows a view of a liquid crystal display apparatus of the present invention.

FIG. 2 shows a view of a spreading method of a conductive agent.

FIG. 3 shows a view of a distribution state of static electricity.

FIG. 4 shows a view of the liquid crystal display apparatus.

FIG. 5 shows a view of another spreading method of a conductive agent.

FIG. 6 shows a graph of the relationship between display non-uniformity and the resistance.

FIG. 7 shows a view of a conventional distribution of static electricity.

DETAILED DESCRIPTION OF THE INVENTION

A construction of a liquid crystal display apparatus of the present invention is described with reference to FIG. 1.

FIG. 1 shows a structure of an IPS panel. Reference numeral 2 denotes a liquid crystal display apparatus which is constituted by a liquid crystal section 4 (hereinafter represents a TFT), a color filter 6, polarizing plates 8 and 10, etc.

The TFT 4 allows to liquid-tightly insert a liquid crystal 16 between a pair of transparent glass substrates mounted in parallel to each other by the interposition of a sealing member 14. Each of the pair of substrates 12 has an electrode (not shown). Therefore, by applying a voltage between the electrodes, the liquid crystal 16 is so changed as to form a character or image.

The color filter 6 is formed with many pixels, and adhered to a surface of the TFT 4 on it display surface side.

The polarizing plates 8 and 10 are respectively adhered to the back surface of the TFT 4 and the front surface of the color filter 6. The polarizing plates 8 and 10 are made up of multi-layered insulating films, and their respective outer surfaces are previously covered with the protective films 3 and 5. Further, a conductive agent 7 is spread on the outer surface of the polarizing plate 8 adhered to the back surface of the TPP 4. That is, the outer surface of the polarizing plate 8 is coated with the conductive agent 7 to which the protective film 3 is adhered.

The conductive agent 7 is a conductive agent having a high resistance which is so spread as to provide a resistance of $1 \times 10^9$ ohms/square with itself. If the resistance of the conductive agent 7 exceeds $1 \times 10^9$ ohms/square, static electricity generated on the surface of the polarizing plate 8 is not uniformly distributed, failing to suppress display non-uniformity due to the static electricity; if the surface resistance is less than $1 \times 10^9$ ohms/square, the conductive agent film 7 formed on the surface of the polarizing plate 8 becomes too thick, resulted in decreasing its transmittance or causing non-uniform thickness (non-uniform coating).

A solvent for forming the conductive agent 7 has a composition of 1% or less of a trialkyl-(2-hydroxyethyl) ammonium salt, 10% or less of pentaexythritol, and 90% or more of ethanol.

Another solvent for the conductive agent 7 has a composition of 5% of tin oxide, 2 to 5% of tetraethoxysilane, 1 to 2% of a polyester resin, and 87 to 90% of water. A film of the conductive agent 7 is formed by spreading the solvent and then drying it.

A method of spreading the conductive agent 7 will be explained.

As shown in FIG. 2, the conductive agent 7 is spread by using a jig generally called a bar-coater 30. At this time, the solvent of the conductive agent 7 is diluted with ethanol or water so as to suppress a non-uniform coating and a decrease in transmittance. The dilution ratio is so adjusted as to provide the conductive agent 7 with a surface resistance of $1 \times 10^9$ ohms/square to $1 \times 10^{12}$ ohms/square after coating.

Next, cancellation of display non-uniformity due to peeling-off of the protective film 3 will be described.

As shown in FIG. 1, when the protective film 3 on the polarizing plate 8 mounted on the side of the TFT 4, where the conductive agent 7 is spread, is peeled off, static electricity is generated by the peeling-off on the surface of the polarizing plate 8. However, the presence of the spread conductive agent 7 prevents the potential from locally increasing, and the static electricity is uniformly distributed on the entire display surface of the polarizing plate 8 as shown in FIG. 3. For this reason, it is unnecessary to remove electrification of the static electricity for a long tine and is free from any display non-uniformity.

FIG. 6 shows the relationship between the surface resistance and occurrence of the display non-uniformity. As is understood from FIG. 6, the display non-uniformity occurs at a resistance of $1 \times 10^{12}$ ohms/square or more. The conductive agent 7 has a property of increasing its surface resistance by $1 \times 10^3$ ohms/square or more over time. Fran this relationship, the most preferable surface resistance upon coating is $1 \times 10^9$ ohms/square.

In the next place, a backlight unit and cancellation of the display non-uniformity will be described with reference to FIG. 4.

FIG. 4 shows the state in which a backlight unit 22 is assembled into the IPS panel adhered with the polarizing plate 8 on which the conductive agent 7 is spread. Upon assembling the backlight unit 22, static electricity generates on the polarizing plate 8. However, the presence of the high-resistance conductive agent 7 on the polarizing plate 8 prevents the potential from locally increasing, and the static electricity is uniformly distributed on the entire display surface. For this reason, even after the backlight unit 22 is assembled, occurrence of display non-uniformity due to electrification of the static electricity can be suppressed.

FIG. 5 shows a photogravure method as another method of spreading the conductive agent 7. According to this method, a doctor roll 36 is brought into contact with a plate cylinder 34 to spread the conductive agent 7.

Using this spreading method, a solvent for the high-resistance conductive agent containing component (1): a trialkyl-(2-hydroxyethyl) ammonium salt, penta-exythritol, and ethanol, or component (2): tin oxide, tetraethoxysilane, a polyester resin, and water may be spread so as to adjust the surface resistance of the polarizing plate 8 mounted on the side of the TFP 4 into $1 \times 10^9$ ohms/square. By this method, the same effects as described above can be obtained.

According to the present invention, after a protective film is peeled off from a polarizing plate, static electricity is uniformly distributed on the polarizing plate without locally electrified thereon, it is unnecessary to take an operation tine for removing electrification of the static electricity.

After assembling a backlight, even when static electricity is generated between the backlight and the polarizing plate, occurrence of display non-uniformity due to static electricity generated can be prevented, because the static electricity is not locally electrified.

What is claimed is:

1. A liquid crystal display apparatus in which a pair of transparent substrates are disposed through a spacer in parallel with each other, and in which a liquid crystal is sealed between the pair of transparent substrates, comprising a first polarizing plate mounted on one surface side of the liquid crystal display apparatus and having a surface resistance of more than $1 \times 10^{16}$ ohms/square, each outer surface of said first polarizing plate having no conductive agent to be coated thereon, and a second polarizing plate mounted on the side of a backlight of the liquid crystal display apparatus, each outer surface of said second polarizing plate having a conductive film formed by coating a conductive agent on the outer surface so as to have a surface resistance of not more than $1 \times 10^{12}$ ohms/square, wherein said conductive agent has a composition of a trialkyl-(2-hydroxyethyl) ammonium salt, pentaerythritol, and ethanol.

2. An apparatus according to claim 1, wherein said conductive agent has a composition of not more than 1% of a trialkyl-(2-hydroxyethyl) ammonium salt, not more than 10% of pentaerythritol, and not less than 90% of ethanol.

3. A liquid crystal display apparatus in which a pair of transparent substrates are disposed through a spacer in parallel with each other, and in which a liquid crystal is sealed between the pair of transparent substrates, comprising a first polarizing plate mounted on one surface side of the liquid crystal display apparatus and having a surface resistance of more than $1 \times 10^{16}$ ohms/square, each outer surface of said first polarizing plate having no conductive agent to be coated thereon, and a second polarizing plate mounted on the side of a backlight of the liquid crystal display apparatus, each outer surface of said second polarizing plate having a conductive film formed by coating a conductive agent on the outer surface so as to have a surface resistance of not more than $1 \times 10^{12}$ ohms/square, wherein said conductive agent has a composition of tin oxide, tetraethoxysilane, and a polyester resin.

4. An apparatus according to claim 3, wherein said conductive agent has a composition of 5% of tin oxide, 2 to 5% of tetraethoxysilane, 1 to 2% of a polyester resin, and 87 to 90% of water.

* * * * *